(12) United States Patent
Kamimura (10) Patent No.: US 6,355,875 B1
(45) Date of Patent: Mar. 12, 2002

(54) COVERED SOLAR CELL AND MANUFACTURING METHOD THEREOF

(75) Inventor: Kunio Kamimura, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/588,688

(22) Filed: Jun. 7, 2000

(30) Foreign Application Priority Data

Jun. 9, 1999 (JP) .......................................... 11-162419

(51) Int. Cl.[7] ..................... H01L 31/0216; H01L 31/048
(52) U.S. Cl. ................... 136/256; 136/257; 136/259; 136/251; 257/432; 257/434; 257/435; 257/461; 438/65; 438/89; 438/98; 438/87
(58) Field of Search ................................. 136/256, 257, 136/259, 251; 257/432, 434, 435, 461; 438/65, 89, 98, 87

(56) References Cited

U.S. PATENT DOCUMENTS 3,653,970 A * 4/1972 Iles .............................. 136/256

5,500,056 A * 3/1996 Wada et al. .................. 136/259

FOREIGN PATENT DOCUMENTS

| EP | 0261885 A1 | * | 3/1988 |
| JP | U-3-126063 | | 12/1991 |
| JP | 3-126063 U | | 12/1991 |
| JP | A-7-169986 | | 7/1995 |
| JP | A-10-93122 | | 4/1998 |
| JP | 10-93122 A | * | 4/1998 |

* cited by examiner

*Primary Examiner*—Alan Diamond
(74) *Attorney, Agent, or Firm*—Nixon & Vanderhye, P.C.

(57) ABSTRACT

A powder glass solution is applied on top of a solar cell 12 with electrodes 17 formed thereon, and solvent is volatilized, followed by baking process, by which a glass 13 is directly formed on the top of the solar cell 12. In this way, the alignment between solar cell and glass as well as the finish work of removing overflowed adhesive are eliminated. Also, by selecting a powder glass having a coefficient of thermal expansion generally similar to that of a P-type silicon substrate 14, distortion by heating due to abrupt temperature changes is reduced. Thus, cost reduction and reliability improvement can be fulfilled.

9 Claims, 7 Drawing Sheets

COVERED SOLAR CELL AND MANUFACTURING METHOD THEREOF

BACKGROUND OF THE INVENTION

The present invention relates to a covered solar cell, as well as a manufacturing method thereof, which enables protection from low energy protons that cause deterioration of electrical characteristics.

In a space covered solar cell to be used as power supply for artificial satellites (shown in FIG. 8), an about 50 μm–1 mm thick cover glass 2 is bonded on top of a solar cell 1 with silicon adhesive 3. Radiations of various energies are flying across the cosmic space. The solar cell 1, when receiving such radiation impinging thereon, suffers crystal defects so that its photoelectric conversion capability is deteriorated. In particular, protons of low energy, upon collision against an object, are absorbed by the very surface without reaching the interior of the object. However, the solar cell 1 has a PN junction at as shallow a portion of its surface as 0.1 μm–0.3 μm, thus resulting in a large deterioration due to collisions of low energy protons.

Figure 8:
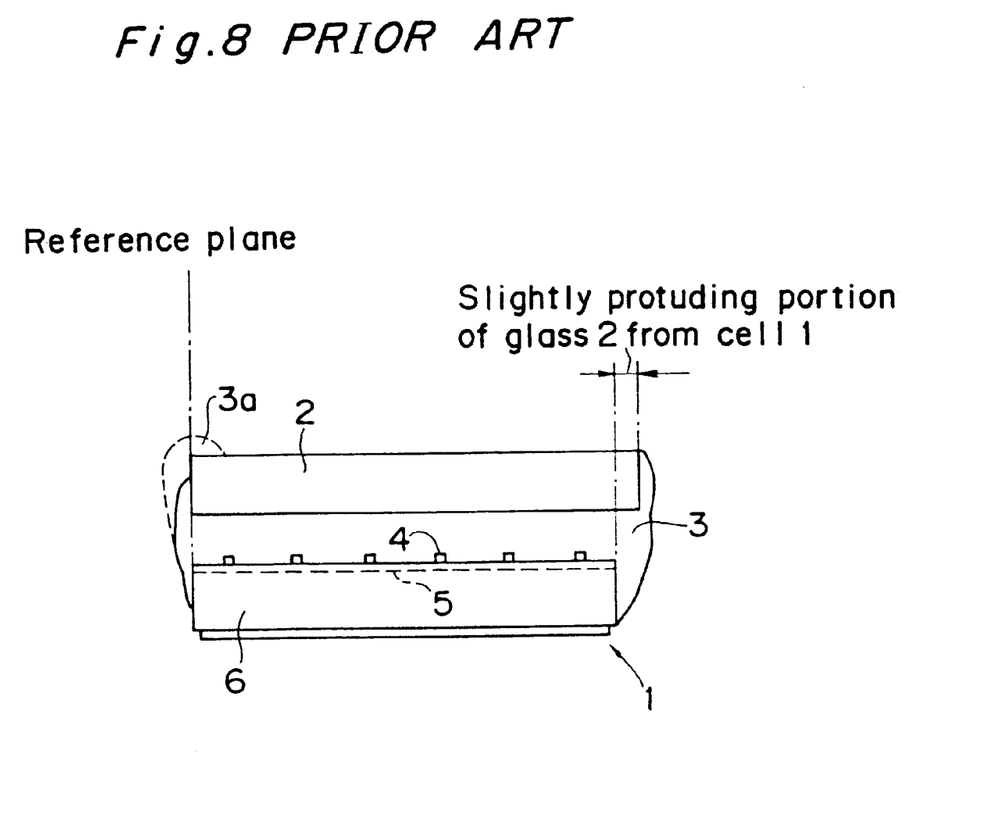
FIG. 8 is a schematic longitudinal sectional view of a covered solar cell according to the prior art.

For this reason, as described above, the about 50 μm–1 mm thick cover glass 2 is bonded on the surface of the space solar cell with the silicon adhesive 3. With the thusly bonded cover glass 2, low energy protons are absorbed by the cover glass 2, and do not reach the solar cell 1. In this way, radiation deterioration of the solar cell 1 is partly prevented by the cover glass 2. In the case of ordinary glasses, since the glass is colored by radiation, cerium (Ce) is added to the glass to prevent the coloring due to radiation.

Surface electrodes 4 of the solar cell 1 are linearly formed with spacings of 0.5 mm– a few mm so as to efficiently take out electric current from a PN junction portion 5, and so designed as to gather at a current takeout portion (not shown). The surface electrodes 4 are formed of silver or other metals having a low resistivity so that the electrical resistance becomes low. There is a further demand for forming the surface electrodes 4 thick to thereby increase the cross section and decrease the electrical resistance. Whereas the surface electrodes 4 are generally formed by vacuum deposition or the like, forming the electrodes thick for lower electrical resistance would take longer time. Thus, a method of increasing the thickness of the surface electrodes 4 by plating is conceivable.

However, the surface electrodes 4, if formed by plating, would be upsized not only in the direction of thickness but also in the direction of width, so that solar light incident on the solar cell 1 would be shielded. On this account, in order to form the surface electrodes 4 thick only in the direction of thickness by plating, there arises a need of patterning with a resist having a thickness larger than the plating thickness. Further, since plating a P-type silicon substrate 6 directly with silver would result in insufficient adhesion strength, it is necessary that after the patterning of a metallic material such as titanium (Ti) into the electrode shape, another patterning for plating be performed so as to surround the patterned metallic material.

One manufacturing method for solar cells is a hydrogen ion peeling process capable of obtaining silicon wafers which are thin and uniform in film thickness (Japanese Patent Laid-Open Publication HEI 10-93122). In this hydrogen ion peeling process, hydrogen ions are implanted into a polysilicon ingot or wafer, and a second substrate is bonded to the implantation-side surface of the ingot or wafer. Then, by performing appropriate heat treatment, a silicon substrate on the second substrate side is peeled in a small thickness. Then, by using this thin-film silicon, a power-saving type covered solar cell is manufactured.

These conventional solar cells, however, have the following problems. In the case of the covered solar cell shown in FIG. 8, silicon adhesive is used as the adhesive 3 for bonding the cover glass 2 as described above. This adhesive 3 is a very expensive refined resin in response to the requirement that out gas be emitted under high temperature and high vacuum in the space be less in amount. This leads to a problem of increased cost. Also, the adhesive 3, although having a property of being soft at normal temperature, yet exhibits an abrupt property change at lower temperatures below −80° C. as compared with silicon and glass. This causes the solar cell 1 and the cover glass 2 to undergo large thermal stress under very low temperature environments. As a result, such faults as damage of the solar cell 1 and the cover glass 2 or peeling of the adhesive 3 are more likely to occur, as a further problem.

The adhesive 3 may overflow to side faces of the solar cell 1 or to the top of the cover glass 2 during the work of bonding the cover glass 2. Since the silicon adhesive 3, when irradiated with ultraviolet rays, would be deteriorated, it is necessary to remove adhesive 3a that has stuck to the surface of the cover glass 2 or flowed over the side faces as described above. However, the work of removing the adhesive 3a may often cause breaks of the very thin cover glass 2, which is as thin as 50 μm–1 mm, or the solar cell 1, thus requiring handling with great precision.

The alignment at the side wall between the solar cell 1 and the cover glass 2 needs to be performed with a dimensional tolerance of, normally, 0.2 mm or less according to the requirements that the solar cell 1 not be exposed and that the cover glass 2 not largely protrude out of the solar cell 1. Besides, when the surface electrodes 4 are formed by plating as described above, the alignment between the ground metal such as titanium (Ti) and the plating patterning for preventing lateral expansion of the surface electrodes 4 needs to be done with high precision. However, this alignment between the ground metal and the plating patterning takes long time for manufacture, making it hard to mass produce the space covered solar cell, as a disadvantage.

Furthermore, in the covered solar cell manufacturing method by the hydrogen ion peeling process, because of a small film thickness of the silicon substrate in the resulting covered solar cell, it is necessary to previously bond a second substrate thereto for mechanical reinforcement. This second substrate is given by an electrically conductive metal material, or an insulating material having optical transmittance to at least part of the solar light, for example, by a glass plate or aluminum plate or the like. In such a case, with a glass plate used as the second substrate, the second substrate is exploited as the cover glass during the formation of the covered solar cell. As a result, during the bonding of the second substrate to the silicon wafer, there may occur problems similar to those in the case of bonding the cover glass to the solar cell. Also, use of aluminum or the like as the second substrate leads to a problem that the cost would be increased proportionally to the second substrate.

SUMMARY OF THE INVENTION

Accordingly, an object of the present invention is to provide a covered solar cell, as well as a manufacturing method thereof, which eliminates the need for the removal of overflowed adhesive and high precision alignment, and which involves less distortion by heating even under iterative environmental changes in the earth and the space.

In order to achieve the above object, an aspect of the present invention provides a covered solar cell in which a transparent glass layer is formed directly on a surface of a solar cell.

With this constitution, a glass plate for radiation protection is formed directly on the surface of the solar cell without the aid of adhesion. Therefore, the need of an expensive adhesive for bonding the glass is eliminated, the work of removing any overflowed adhesive is eliminated, and alignment faults between the solar cell and the glass plate are eliminated, by which a cost reduction is achieved. Further, thermal stresses on the solar cell and the glass plate due to property changes of the adhesive under low temperatures are eliminated, and thus damage of the solar cell and the glass plate or peeling of the adhesive can be reduced.

In one embodiment, the transparent glass layer is formed by baking powder glass.

With this constitution, a solution of powder glass dissolved with a solvent is applied to the surface of the solar cell and the solvent is volatilized, by which the powder glass layer is formed simply and directly on the surface of the solar cell.

In one embodiment, cerium is included in the transparent glass layer.

With this constitution, since cerium is included in the transparent glass layer, the transparent glass layer can be prevented from coloring due to radiation.

In one embodiment, the transparent glass layer is made up by stacking a plurality of glass layers having different refractive indices.

With this constitution, the optical reflectivity of the surface of the transparent glass layer can be reduced by such a setting that the plurality of glass layers making up the transparent glass layer have refractive indices increasing gradually from solar cell side toward outside. Thus, the rate of absorption to the solar light is increased so that the photoelectric conversion efficiency is improved.

In one embodiment, thickness of the transparent glass layer is 50 $\mu$m–1000 $\mu$m.

With this constitution, protons of low energy, which upon collision against an object, are absorbed by the very surface without reaching interior of the object, are effectively absorbed by the transparent glass layer having a necessary minimum thickness.

In one embodiment, the transparent glass layer is formed except a surface electrode formation region.

With this constitution, since the transparent glass layer is formed except the surface electrode formation region, the transparent glass layer is used as a plated electrode formation pattern in later process of forming the surface electrodes in the surface electrode formation region by plating.

In one embodiment, the transparent glass layer is an adhesion layer for bonding radiation protection glass onto the surface of the solar cell.

With this constitution, the glass for radiation protection is bonded to the surface of the solar cell by a transparent glass layer of the same material as the radiation protection glass. Therefore, the need for expensive silicon adhesive is eliminated in the formation of the covered solar cell. Further, since the transparent glass layer as an adhesion layer is superior in ultraviolet resistance, the work of removing overflowed transparent glass layer can be eliminated, so that a cost reduction can be achieved. Further, thermal stresses on the solar cell and the glass plate due to property changes of the adhesion layer under low temperatures are eliminated, and thus damage of the solar cell and the glass plate or peeling of the adhesive is reduced.

One aspect of the present invention provides a method for manufacturing the covered solar cell, comprising a step for forming the transparent glass layer by:

applying a solution of powder glass dissolved with a solvent onto the surface of the solar cell, volatilizing the solvent, and thereafter baking the powder glass.

With this constitution, the transparent glass layer is formed directly on the surface of the solar cell without the aid of adhesion. Thus, the need for expensive adhesive for bonding the radiation protection glass is eliminated, the work of removing overflowed adhesive is eliminated, and alignment faults between the solar cell and the radiation protection glass plate are eliminated, thus allowing a cost reduction to be achieved. Further, thermal stresses on the solar cell and the glass plate due to property changes of the adhesive under low temperatures are eliminated, and thus damage of the solar cell and the glass or peeling of the adhesive is reduced.

One aspect of the present invention provides a method for manufacturing the covered solar cell, comprising the steps of:

forming a PN junction on a surface of a semiconductor wafer;

applying photoresist overall on the surface of the semiconductor wafer, and thereafter performing a patterning so that the photoresist is left only in the surface electrode formation region;

applying a solution of powder glass dissolved with a solvent overall on the surface of the semiconductor wafer, volatilizing the solvent, and thereafter baking the powder glass; and removing the photoresist and thereafter forming surface electrodes by plating.

With this constitution, since the transparent glass layer is formed except the surface electrode formation region, the transparent glass layer is exploited as a plated electrode formation pattern in the process of forming the surface electrodes in the surface electrode formation region by plating. Further, since no exclusive-use plated electrode formation pattern is required, the need of alignment between the surface electrodes and the plated electrode formation pattern is eliminated, so that the surface electrodes can be formed quite simply.

One aspect of the present invention provides a method for manufacturing the covered solar cell, comprising the steps of:

forming a PN junction on a surface of a semiconductor wafer;

forming a ground metal in the surface electrode formation region on the surface of the semiconductor wafer; and applying a solution of powder glass dissolved with a solvent overall on the surface of the semiconductor wafer including the ground metal, volatilizing the solvent, and thereafter baking the powder glass.

With this constitution, since the solution is repelled by the ground metal, the transparent glass layer is formed except the surface electrode formation region. Therefore, the transparent glass layer is exploited as a plated electrode formation pattern in the process of forming the surface electrodes on the ground metal by plating. Further, the need for alignment between the ground metal for the surface electrodes and the transparent glass layer is eliminated, so that the surface electrodes are formed quite simply. In addition to this, the need of patterning photoresist for the formation of the transparent glass layer is eliminated, so that the surface electrodes are formed even more simply than in the preceding embodiment of the invention.

One aspect of the present invention provides a method for manufacturing the covered solar cell, comprising the steps of:

applying a solution of powder glass dissolved with a solvent onto a surface of the radiation protection glass;

applying a solution of the powder glass dissolved with a solvent onto a surface of the solar cell;

bonding together the solar cell and the radiation protection glass at surfaces thereof onto which their corresponding solutions have been applied; and volatilizing the solvent and thereafter baking the powder glass.

With this constitution, the radiation protection glass is bonded to the surface of the solar cell by a transparent glass layer made of the same material as the radiation protection glass. Therefore, no expensive silicon adhesive is required. Further, since the transparent glass layer as an adhesion layer is superior in ultraviolet resistance, the work of removing overflowed transparent glass layer is eliminated so that a cost reduction can be achieved. Furthermore, thermal stresses on the solar cell and the glass plate due to property changes of the adhesive under low temperatures are eliminated, and thus damage of the solar cell and the glass or peeling of the adhesive is reduced.

One aspect of the present invention provides a method for manufacturing a covered solar cell, comprising steps of:

manufacturing a covered solar cell according to the covered solar cell manufacturing method; and peeling to a specified thickness a rear side surface of the semiconductor wafer in the covered solar cell formed by the preceding step.

With this constitution, in manufacturing a power-saving type covered solar cell by using a thin film semiconductor substrate peeled into a specified thickness on its rear side, the thin film semiconductor substrate is mechanically reinforced by the transparent glass layer. Therefore, the need for bonding an exclusive-use substrate for reinforcing the thin film semiconductor substrate is eliminated, so that problems and cost increases involved in the bonding of the exclusive-use substrate are solved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
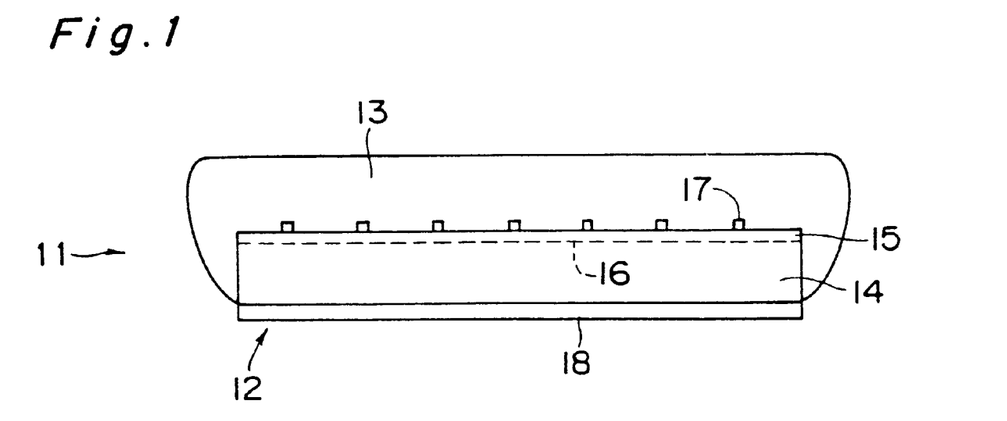
FIG. 1 is a schematic longitudinal sectional view of a covered solar cell according to the present invention.

FIG. 1 is a schematic longitudinal sectional view of a covered solar cell according to a first embodiment. In the covered solar cell 11 of this embodiment, a glass for radiation protection (hereinafter, referred to simply as glass) 13 is formed directly on the surface of a solar cell 12 without the aid of adhesive. The structure of the solar cell 12 being the same as that of the conventional solar cell 1 shown in FIG. 8, an N+ layer 15 is formed on the surface of a P-type silicon substrate 14, forming a PN junction portion 16. Then, N electrodes 17 are formed into a linear shape with spacings of 0.5 mm–a few mm on the surface of the N+ layer 15, and a P electrode 18 is formed on the surface of the P-type silicon substrate 14.

Figure 2:
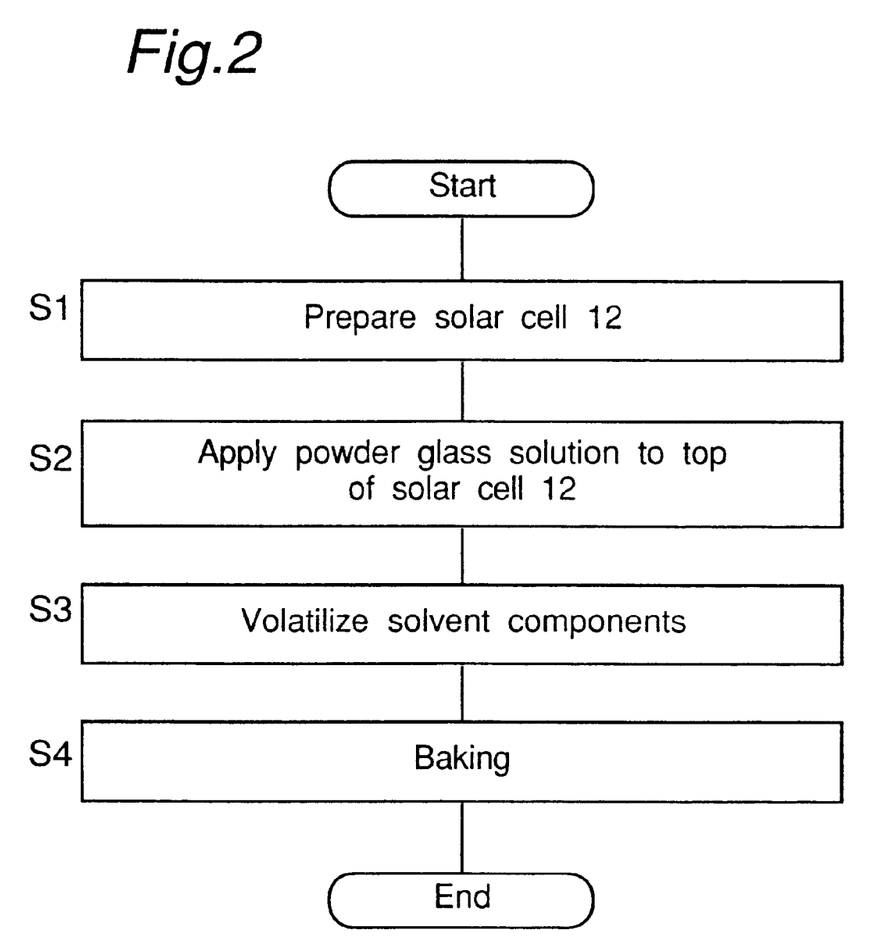
FIG. 2 is a chart showing the procedure for forming a glass in FIG. 1.

FIG. 2 is a chart showing the procedure for forming the glass 13 in the covered solar cell 11 having the above constitution. First, the solar cell 12 having the constitution shown in FIG. 1 is prepared (step S1). Then, a solution of powder glass dissolved with a solvent is applied onto a surface of the solar cell 12 on the N electrode 17 side (step S2). After these steps, solvent components are volatilized, followed by drying (step S3). It is noted that because the glass 13 formed by one-time application of the solution is too thin for a radiation protective glass of 20 μm or so, the steps S2 and S3 are iterated over and over again so that the glass 13 is formed in a stack of layers. Thus, after layers of the glass 13 having a desired thickness (50 μm–1 mm or so) are formed, the powder glass is melted by baking, by which glass 13 is finally formed (step S4). It is noted that baking temperature in this baking process is 400° C.–750° C.

As an example of this embodiment, a case where GP-5210 made by Nihon Denki Garasu K.K. was used as the powder glass is described. First, an N-type dopant layer (N+ layer) is formed on both sides of a P-type silicon wafer of 10 Ω by thermal diffusion process. After removing a dopant layer on one of the sides by etching, a solution in which the GP-5210 has been dissolved in a solvent composed primarily of alcohol is applied onto a remaining dopant layer on the P-type silicon wafer. Next, alcohol components are evaporated, and then a baking process is effected two times at 600° C. and 720° C.

As shown above, in this embodiment, a solution made by dissolving powder glass with a solvent is applied onto the electrode 17 side surface of the solar cell 12, on which the electrodes 17, 18 are formed. Thereafter, the solvent components are volatilized, followed by baking process, by which the layer of the glass 13 is formed directly. Therefore, layer of the glass 13 can be formed uniformly on the surface of the solar cell 12, thus eliminating the needs for troublesome alignment between the solar cell and the glass and for the finish work of removing overflowed adhesive. Also, by selecting a powder glass capable of forming a glass 13 that exhibits a coefficient of thermal expansion generally equivalent to the solar cell 12 (P-type silicon substrate 14), distortion by heating due to large temperature variations caused by environmental changes of the earth and the space and due to temperature cycles can be reduced.

According to this embodiment, cost reductions are enabled by virtue of the facts that no expensive adhesives are required, that the manufacturing process is simplified by eliminating the step of removing unnecessary adhesive, and that the product yield is improved by eliminating the alignment between the solar cell and the glass, and the like. Further, such faults as damage of the solar cell 12 and the glass 13 or peeling of the glass 13 due to the distortion by heating can be eliminated, and the reliability can be improved.

(Second Embodiment)

In the first embodiment, as described above, since enough thickness of the glass 13 cannot be obtained with a one-time application of the solution made by dissolving powder glass with a solvent, the glass 13 is formed in a stack of layers by iterating the application of the solution. In this first embodiment, in forming the glass 13 as a plurality of layers, the refractive index of powder glass with which the layers are formed differs from layer to layer.

Figure 3:
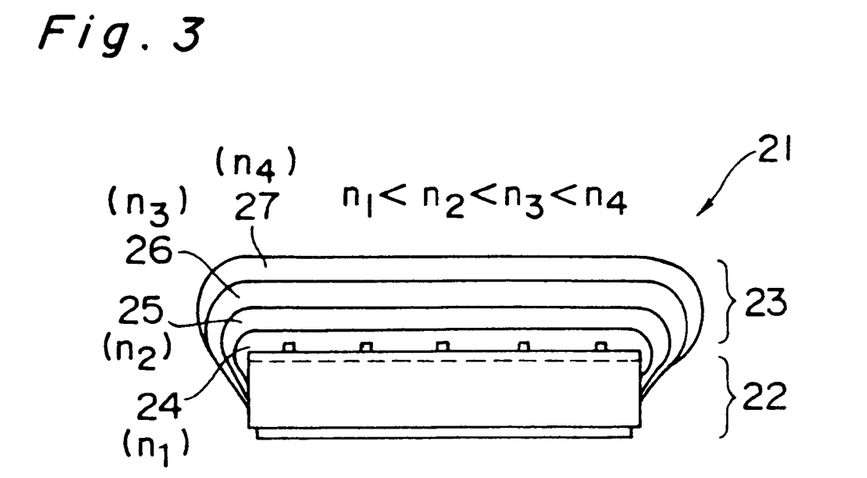
FIG. 3 is a schematic longitudinal sectional view of a covered solar cell other than FIG. 1.

In this case, as shown in FIG. 3, glass layers 24–27 are formed in a plurality of layers so that the refractive index n increases from a surface side toward an outer side of a solar cell 22. By so doing, in addition to the effects of the first embodiment, the reflectance to solar light at the surface of a glass 23 can be reduced. Therefore, the rate of absorption of solar light by a covered solar cell 21 can be increased so that the efficiency of photoelectric conversion can be improved. It is noted that the procedure for forming the glass 23 is similar to that shown in FIG. 2.

(Third Embodiment)

Figure 4:
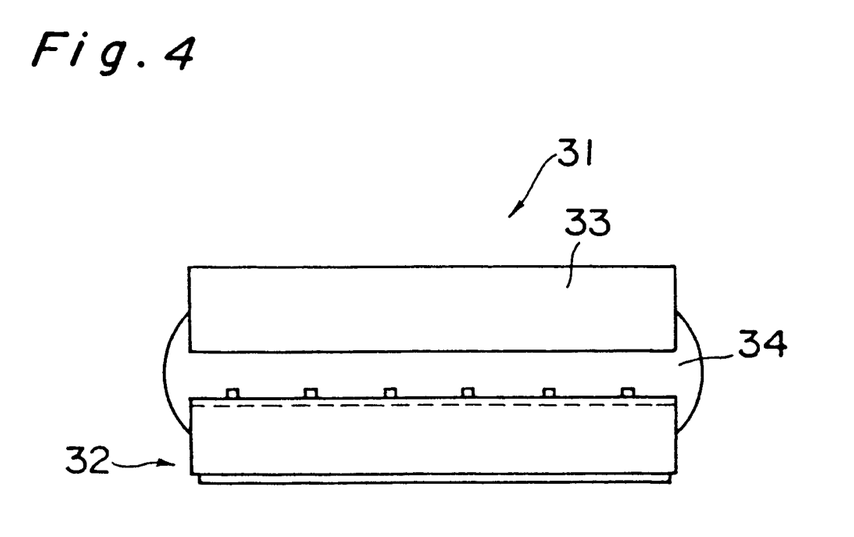
FIG. 4 is a schematic longitudinal sectional view of a covered solar cell other than FIGS. 1 and 3.

In the foregoing embodiments, powder glass is used for the formation of the radiation protection glasses 13, 23. In those cases, however, when a thick glass is required as the glass for radiation protection, a very large number of iterations of application of the powder glass solution may be involved, causing a large number of stacked glass layers to be formed, with the result that a uniform radiation protection glass cannot be obtained. As a solution to such a case, in this third embodiment, the powder glass is used for the bonding of the solar cell and the radiation protection glass. In this third embodiment, as shown in FIG. 4, a radiation protection glass 33 is bonded to the surface of a solar cell 32 with a glass layer 34 formed of powder glass to form a covered solar cell 31.

Figure 5:
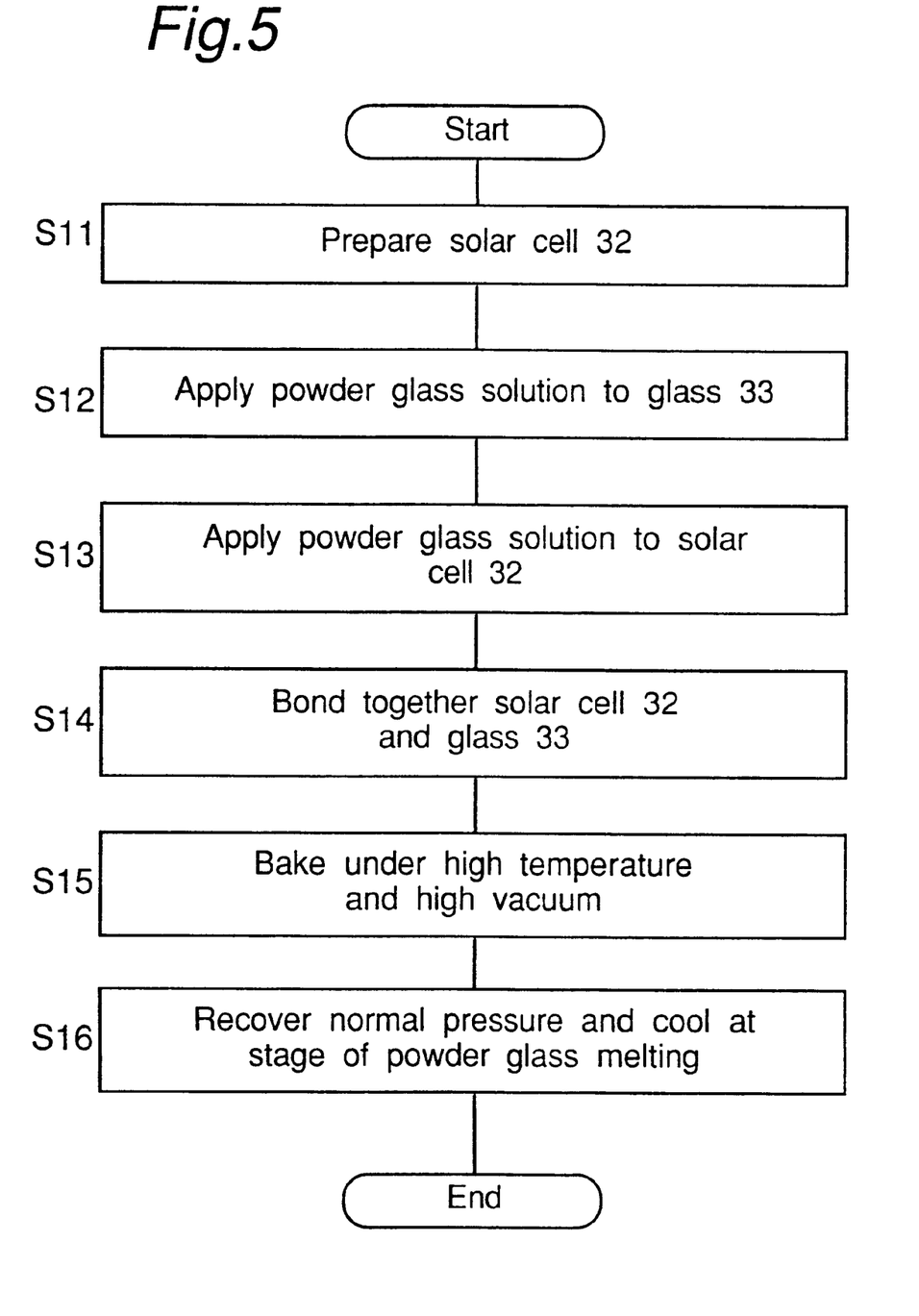
FIG. 5 is a chart showing the procedure for bonding the glass in FIG. 4.

FIG. 5 is a chart showing the procedure for bonding the glass 33 in the covered solar cell 31 having the constitution of the third embodiment. First, the solar cell 32 is prepared (step S11). Then, a solution of powder glass is also applied to the glass 33 (step S12). The powder glass solution is applied to the surface of the solar cell 32 (step S13). Thereafter, the solar cell 32 and the glass 33 are bonded together (step S14), and baked under high temperature and high vacuum (step S15). Then, at the stage where the powder glass is melted, steady pressure is applied, followed by cooling (step S16). In this way, the radiation protection glass 33 is finally bonded.

According to this embodiment, even if a thick glass is required as the glass for radiation protection, the glass can be formed simply by less application of the powder glass solution. Also, the glass layer 34 as an adhesion layer between the solar cell 32 and the radiation protection glass 33 can be formed thinly and uniformly by a thin application of the powder glass solution. Therefore, the glass layer 34 protrudes only a small amount, but since the protruding glass layer 34 is superior in ultraviolet resistance, it is unnecessary to remove. Thus, the finish process after the bonding can be simplified and a cost reduction can be achieved. Further, also in this embodiment, by uniformizing the coefficient of thermal expansion among the solar cell (P-type silicon substrate) 32, the glass 33, and the glass layer 34, distortion by heating due to large temperature variations caused by environmental changes of the earth and space and due to temperature cycles can be reduced, so that such faults as damage of the solar cell 32 and the glass 33 or peeling of the glass 33 can be eliminated, and a high reliability can be obtained.

(Fourth Embodiment)

The foregoing embodiments have been described with the glass 13, 23, 33 being formed or bonded on the solar cell 12, 22, 32 with the N electrodes 17 formed on the surface of the N+ layer 15. In contrast, the fourth embodiment forms electrodes by plating after the glass is formed on the surface of the N+ layer. Further details are described below.

Figure 6A:
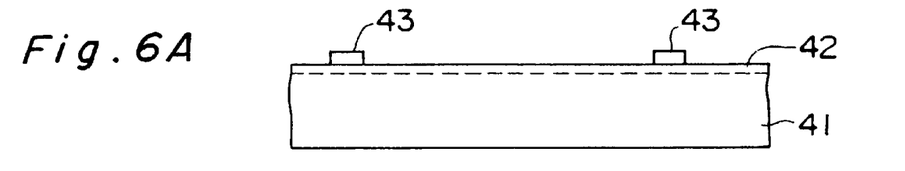
FIGS. 6A, 6B, 6C and 6D are views showing the method of forming the glass and electrodes in a covered solar cell other than FIGS. 1, 3 and 4.

FIGS. 6A, 6B, 6C and 6D show the process for forming the radiation protection glass and the electrodes according to the fourth embodiment. First, as shown in FIG. 6A, an N+ layer 42 is formed on the surface of a P-type silicon substrate 41, and further a ground metal 43 of titanium (Ti) or the like is patterned on the N+ layer 42.

Figure 6B:
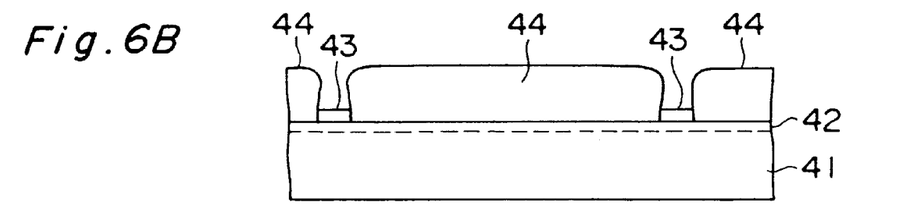
Figure 6C:
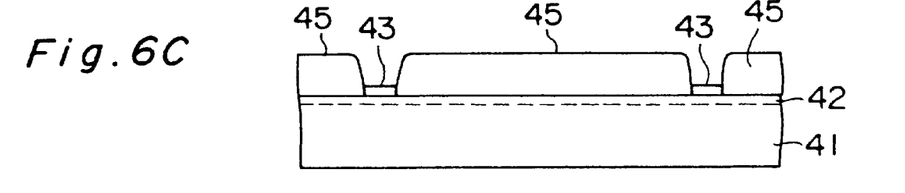
Figure 6D:
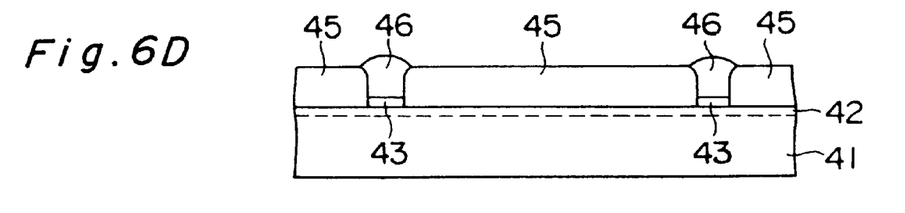

Next, as shown in FIG. 6B, a solution 44 obtained by dissolving powder glass in a solvent is applied overall. In this process, since the powder glass solution 44 is repelled at ground metal 43 portions, the applied powder glass solution 44 is patterned except at the ground metal 43 portions. After these steps, the solvent is volatilized and baking process is performed, by which a glass 45 is formed as shown in FIG. 6C. Thereafter, as shown in FIG. 6D, the ground metal 43 is plated thereon with silver or the like, by which plated electrodes 46 are formed. In this process, since glass 45 walls are present on both sides of the ground metal 43, the plated electrode 46 is formed only thicknesswise.

As shown above, according to this fourth embodiment, since the glass 45 formed on the surface of the N+ layer 42 is used as a pattern for the formation of the plated electrodes, there is no need for the plated electrode formation pattern made of exclusive-use resist or the like that prevents the plated electrodes 46 from laterally expanding. Also, since the formed glass 45 is patterned except at the ground metal 43 portions, there is no need for alignment between the ground metal 43 and the glass 45. Therefore, it is quite easy to form the plated electrodes 46, thus making it easy to mass produce the space covered solar cell.

In this fourth embodiment, by taking advantage of the fact that the solution 44 obtained by dissolving powder glass in a solvent is repelled by the ground metal 43 portions, the powder glass solution 44 is patterned except at the surface electrode formation region. However, the present invention is not limited to this, and the powder glass solution may be patterned to except the surface electrode formation region in the following fashion, as an example.

In this example, an N+ layer is first formed on the surface of the P-type silicon substrate. Then, photoresist is applied overall on the P-type silicon substrate and patterned in such a way that the photoresist is left only on the surface electrode formation region. Next, a solution obtained by dissolving powder glass with a solvent is applied overall on the P-type silicon substrate, and after volatilizing the solvent, the powder glass is baked, by which a radiation protection glass is formed. Thereafter, the resist is removed, and a ground metal is formed in the surface electrode formation region. Then, on this ground metal, the surface electrodes are formed by plating. In this case also, since glass walls are present on both sides of the ground metal, the plated electrode are formed only thicknesswise. Further, since there is no need for alignment between the ground metal and the radiation protection glass, it is quite easy to form the plated electrodes, thus making it easy to mass produce the space covered solar cell.

(Fifth Embodiment)

Figure 7A:
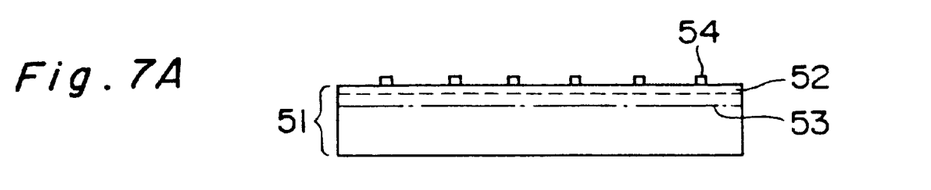
FIGS. 7A, 7B, 7C and 7D are explanatory views of a manufacturing method for a covered solar cell other than FIGS. 1, 3, 4 and 6.
Figure 7B:
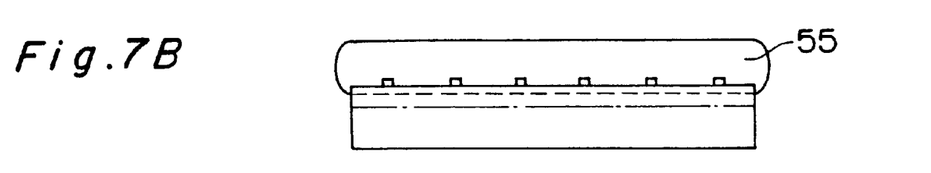
Figure 7C:
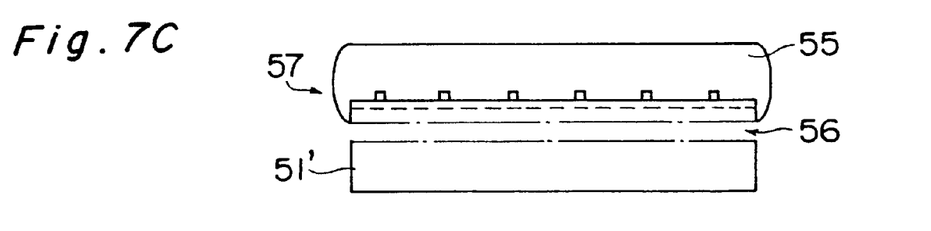
Figure 7D:
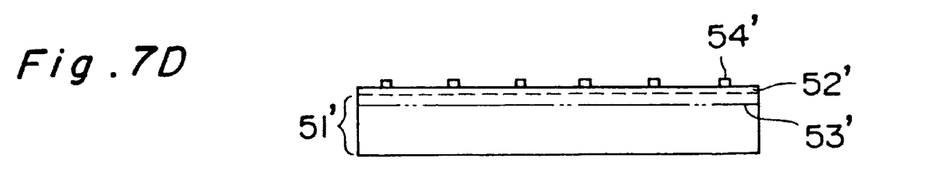

The fifth embodiment applies the present invention to the hydrogen ion peeling process as described before. FIGS. 7A, 7B, 7C and 7D show the glass formation process according to this fifth embodiment. First, as shown in FIG. 7A, an N+ layer 52 is formed in the surface of a P-type silicon substrate 51, and after hydrogen ions are implanted up to a peeling position (hydrogen implantation layer) 53, N electrodes 54 are formed. Then, as shown in FIG. 7B, a glass 55 is formed on the N+ layer 52 side surface according to the process of any one of the first to fourth embodiments. Next, heat treatment is performed, and the surface of the P-type silicon substrate 51 is peeled at the position of the hydrogen implantation layer 53 (56) as shown in FIG. 7C. Then, a P electrode (not shown) is formed on the peeled surface, by which a very thin covered solar cell 57 with the radiation protection glass 55 formed therein is obtained. In this case, the radiation protection glass 55 serves as a reinforcement material for thin film silicon. Meanwhile, with reuse of a P-type silicon substrate 51' resulting after the peeling of the covered solar cell 57, as shown in FIG. 7D, an N+ layer 52' is formed and hydrogen ions are implanted up to a hydrogen implantation layer 53', after which N electrodes 54' are formed. From this onward, the steps as described above are iterated.

As shown above, in this fifth embodiment, the N+ layer 52 is formed on the surface of the P-type silicon substrate 51, hydrogen ions are implanted, the N electrodes 54 are formed, and thereafter the radiation protection glass 55 is formed on the N+ layer 52 side surface. After that, the peeling is performed by performing a heat treatment. As a result, the radiation protection glass 55 can be utilized as a reinforcement material for the thin film silicon, thus eliminating the need of bonding an exclusive-use substrate for mechanical reinforcement of the thin film silicon. Therefore, a cost reduction can be achieved correspondingly. Further, since the radiation protection glass 55 is formed directly on the P-type silicon substrate 51 without using any adhesive, various problems involved in the case where glass is bonded with adhesive can be solved, as in the first to fourth embodiments.

Although no particular description has been given in the foregoing embodiments, adding cerium into the solution made by dissolving powder glass with a solvent during the formation of the radiation protection glass 13, 23, 45, 55 and the glass layer 34 for bonding use makes it possible to prevent the resulting glass from coloring due to radiation.

As apparent from the foregoing description, in the covered solar cell according to the present invention, since the transparent glass layer is formed directly on the surface of the solar cell, there is no need of bonding the glass plate for radiation protection to the surface of the solar cell. Therefore, the need for expensive adhesive for bonding the glass is eliminated, the work of removing overflowed adhesive is eliminated, and alignment faults between the solar cell and the glass plate are eliminated, thus allowing a cost reduction to be achieved. Further, thermal stresses on the solar cell and the glass plate due to property changes of the adhesive under low temperatures are eliminated, and thus damage of the solar cell and the glass plate or peeling of the adhesive can be reduced.

Also, in the covered solar cell according to one embodiment, the transparent glass layer is formed by baking powder glass. Therefore, the solution obtained by dissolving the powder glass with a solvent is applied to the surface of the solar cell and the solvent is volatilized, by which the powder glass layer is formed. Thus, the transparent glass layer can be formed on the surface of the solar cell easily and directly without the aid of adhesion.

In the covered solar cell according to one embodiment, the transparent glass layer is formed by baking powder glass. Therefore, the solution obtained by dissolving the powder glass with a solvent is applied to the surface of the solar cell and the solvent is volatilized, by which the powder glass layer is formed. Thus, the transparent glass layer can be formed on the surface of the solar cell easily and directly without the aid of adhesion.

In the covered solar cell according to one embodiment, since cerium is included in the transparent glass layer, the transparent glass layer can be prevented from coloring due to radiation.

In the covered solar cell according to one embodiment, the transparent glass layer is made up by stacking a plurality of glass layers having different refractive indices. Therefore, the optical reflectivity of the surface of the transparent glass layer can be reduced by such a setting that the plurality of glass layers making up the transparent glass layer have refractive indices increasing gradually from solar cell side toward outside. Thus, the rate of absorption of solar light can be increased so that the photoelectric conversion efficiency can be improved.

In the covered solar cell according to one embodiment, the thickness of the transparent glass layer is 50 $\mu$m–1000 $\mu$m. Therefore, protons of low energy, which upon collision against an object are absorbed by the very surface without reaching interior of the object, can be effectively absorbed by the transparent glass layer having a required minimum thickness.

The transparent glass layer in the covered solar cell according to one embodiment is formed to except the surface electrode formation region. Therefore, in later process of forming the surface electrodes in the surface electrode formation region by plating, the transparent glass layer can be used as a plated electrode formation pattern, thus allowing a cost reduction to be achieved. Further, the need of alignment between the ground metal for surface electrodes and the pattern for plated electrode formation is eliminated, thus making it quite simple to form the plated electrodes and making it easy to mass produce the space covered solar cell.

In the covered solar cell according to one embodiment, the transparent glass layer is used as an adhesion layer for bonding the radiation protection glass. Therefore, even if a thick glass is required as the glass for radiation protection, the transparent glass layer can be formed simply without using any expensive silicon adhesive. Further, since the transparent glass layer as an adhesion layer is superior in ultraviolet resistance, the work of removing overflowed transparent glass layer can be eliminated. Therefore, a cost reduction can be achieved. Further, thermal stresses on the solar cell and the glass plate due to property changes of the adhesion layer under low temperatures are eliminated, and thus damage of the solar cell and the glass plate or peeling of the adhesive can be reduced.

In the method for manufacturing a covered solar cell according to one embodiment, a solution obtained by dissolving powder glass with a solvent is applied onto the surface of the solar cell, and after the solvent is volatilized, the powder glass is baked, by which the transparent glass layer is formed. Therefore, the transparent glass layer can be easily formed directly on the surface of the solar cell without the aid of adhesion. Thus, the need for any expensive adhesive is eliminated, the work of removing overflowed adhesive is eliminated, and alignment faults between the solar cell and the radiation protection glass plate are eliminated, thus allowing a cost reduction to be achieved.

Further, thermal stresses on the solar cell and the glass plate due to property changes of the adhesive under low temperatures are eliminated, and thus damage of the solar cell and the glass or peeling of the adhesive can be reduced.

In the method for manufacturing a covered solar cell according to one embodiment, a PN junction is formed on the surface of a semiconductor wafer, photoresist is applied overall on the surface of the semiconductor wafer, and with the photoresist left only in the surface electrode formation region, powder glass solution is applied overall on the semiconductor wafer. Then, the solution is volatilized and the powder glass is baked, and after removing the resist, the surface electrodes are formed by plating. Therefore, in the process of forming the surface electrodes by plating, the transparent glass layer can be exploited as a plated electrode formation pattern, thus allowing a cost reduction to be achieved. Further, since no exclusive-use plated electrode formation pattern is required, the need of alignment between the surface electrodes and the plated electrode formation pattern is eliminated, thus making it quite simple to form the plated electrodes and making it easy to mass produce the solar cell.

In the method for manufacturing a covered solar cell according to one embodiment, a PN junction is formed on the surface of a semiconductor wafer, a ground metal is applied in a surface electrode formation region on the surface of the semiconductor wafer, and a powder glass solution is applied overall on the surface of the semiconductor wafer including the ground metal. Then, after the solution is volatilized, the powder glass is baked. Therefore, the transparent glass layer can be formed except the surface electrode formation region, and the same effects as in the foregoing embodiment can be produced. In addition to this, there is no need for patterning of photoresist for use of the transparent glass layer formation, and thus the surface electrodes can be formed even more simply than in the foregoing embodiment.

In the method for manufacturing a covered solar cell according to one embodiment, a powder glass solution is applied onto the surface of the radiation protection glass, the powder glass solution is applied onto the surface of the solar cell, and the solar cell and the radiation protection glass are bonded together. Then, after the solvent is volatilized, the powder glass is baked. Therefore, the radiation protection glass can be bonded to the surface of the solar cell by using a transparent glass layer made of the same material as the radiation protection glass. Thus, the same effects as in an embodiment of the invention can be produced.

In the method for manufacturing a covered solar cell according to an embodiment, a solar cell is formed by a covered solar cell manufacturing method according to any one of the foregoing embodiments, and the rear side of the semiconductor wafer in the resulting covered solar cell is peeled to a specified thickness. Therefore, in the process of manufacturing a power-saving type covered solar cell by using a thin film semiconductor substrate, the thin film semiconductor substrate can be mechanically reinforced by the transparent glass layer. Thus, the need of bonding an exclusive-use substrate for reinforcement can be eliminated, and thus problems and cost increases involved in the bonding of the exclusive-use substrate can be solved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a covered solar cell comprising the steps of:

forming a PN junction on a surface of a semiconductor wafer;

applying a photoresist overall on the surface of the semiconductor wafer, and thereafter performing a patterning so that the photoresist is left only in a surface electrode formation region;

applying a solution of powder glass dissolved with a solvent overall on the surface of the semiconductor wafer, volatilizing the solvent, and thereafter baking the powder glass so as to form a transparent glass layer on the semiconductor wafer except the surface electrode formation region; and removing the photoresist and thereafter forming surface electrodes on the surface electrode formation region by plating.

2. The method of claim 1, further comprising peeling to a specified thickness a rear side surface of the semiconductor wafer while leaving the covered solar cell already formed.

3. A method for manufacturing a covered solar cell comprising the steps of:

applying a solution of powder glass dissolved with a solvent onto a surface of radiation protection glass;

applying a solution of the powder glass dissolved with a solvent onto a surface of a solar cell formed on a front surface side of a semiconductor wafer;

bonding together the solar cell and the radiation protection glass at surfaces thereof onto which their corresponding solutions have been applied; and volatilizing the solvent and thereafter baking the powder glass at a temperature in the range of 400° C. to 750° C.

4. The method of claim 3, further compromising peeling to a specified thickness a rear side surface of the semiconductor wafer while leaving the covered solar cell already formed.

5. A method for manufacturing a covered solar cell, comprising steps of:

forming a transparent glass layer onto a surface of a solar cell formed on a front surface side of a semiconductor wafer by applying a solution of powder glass dissolved with a solvent onto the surface of the solar cell, volatilizing the solvent, and thereafter baking the powder glass; and peeling to a specified thickness a rear side surface of the semiconductor wafer while leaving the covered solar cell formed by the preceding step.

6. A covered solar cell comprising:

a substrate;

a PN junction layer formed on the substrate;

electrodes formed on the PN junction layer; and a cover overlying the electrodes and P-N junction layer, wherein the cover is made by stacking plural glass layers which are formed by baking powder glass and have different refractive indices, and wherein the farther apart a particular glass layer is positioned from the substrate, the greater the refractive index of the particular glass layer.

7. A method of forming a covered solar cell comprising:

forming a PN junction layer on a substrate;

forming electrodes on the PN junction layer;

forming a cover overlying the electrodes and PN junction layer by depositing plural glass layers of different refractive indices, wherein the farther apart a particular glass layer is positioned from the substrate, the greater the refractive index of the particular glass layer.

8. A method for manufacturing a solar cell comprising:

forming a PN junction on a surface of a semiconductor wafer;

forming a ground metal in a surface electrode formation region on the surface of the semiconductor wafer;

applying a solution of powder glass dissolved with a solvent over the surface of the semiconductor wafer including the ground metal and processing the solution in a manner wherein the ground metal repels glass formation in the surface electrode formation region, resulting in the formation of trenches in the surface electrode formation region; and forming electrodes in the trenches.

9. The method of claim 8, further comprising peeling to a specified thickness a rear side surface of the semiconductor wafer while leaving the covered solar cell already formed.

* * * * *